(12) United States Patent
Woo

(10) Patent No.: US 7,642,117 B2
(45) Date of Patent: Jan. 5, 2010

(54) CMOS IMAGE SENSOR

(75) Inventor: Hyuk Woo, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 313 days.

(21) Appl. No.: 11/616,272

(22) Filed: Dec. 26, 2006

(65) Prior Publication Data

US 2007/0145425 A1    Jun. 28, 2007

(30) Foreign Application Priority Data

Dec. 28, 2005  (KR) ............... 10-2005-0132648

(51) Int. Cl.
*H01L 21/00* (2006.01)
(52) U.S. Cl. ............. 438/69; 257/432; 257/E27.133; 257/E31.058
(58) Field of Classification Search ............... 438/7, 438/69, 70, 66; 257/290, 432, E27.133, E31.058, 257/E31.063, E31.115
See application file for complete search history.

(56) References Cited

U.S. PATENT DOCUMENTS

2002/0102498 A1*  8/2002  Hsin .................. 430/321

FOREIGN PATENT DOCUMENTS

| KR | 1020030037292 | 5/2003 |
|---|---|---|
| KR | 10-2004-0059760 | 7/2004 |
| WO | WO 2005/091784 | 10/2005 |

* cited by examiner

*Primary Examiner*—Quoc D Hoang
(74) *Attorney, Agent, or Firm*—Sherr & Vaughn, PLLC

(57) ABSTRACT

Embodiments relate to a complementary metal oxide semiconductor (CMOS) image sensor. According to embodiments, the CMOS image sensor may include a semiconductor substrate, an interlayer insulating layer, a color filter layer, an overcoat layer, and a plurality of microlenses. The semiconductor substrate may include a plurality of photodiodes and transistors with a constant interval. The color filter layer may be formed on the interlayer insulating layer, and respective color filters of the color filter layer correspond to respective photodiodes. The overcoat layer may have rounded trenches at a portion corresponding to each photodiode and may be formed on a surface of the semiconductor substrate. Each of the plurality of microlenses may have a convex lens shape and is formed inside the trench.

13 Claims, 9 Drawing Sheets

- Related Art -

CMOS IMAGE SENSOR

The present application claims priority under 35 U.S.C. 119 and 35 U.S.C. 365 to Korean Patent Application No. 10-2005-0132648 (filed on Dec. 28, 2005), which is hereby incorporated by reference in its entirety.

BACKGROUND

An image sensor may be a semiconductor device to convert an optical image into an electrical signal. The image sensor may be generally classified into a charge coupled device (CCD) and a CMOS image sensor (CIS).

The CCD may have a complicated driving method and high power consumption. It may also require a plurality of photolithography processes during fabrication. Accordingly, the CCD may have a disadvantage of having complicated manufacturing process. CMOS image sensors may be considered as next generation image sensors and may overcome various disadvantages of the CCD.

The CMOS image sensor may include photodiodes and MOS transistors in a unit pixel, and may sequentially detect electrical signals of respective unit pixels in a switching manner to realize an image.

FIG. 1 is an example cross-sectional diagram of a related art CMOS image sensor.

Referring to FIG. 1, interlayer insulating layer 108 may be formed on a substrate (not shown), which may include transistors (not shown) and photodiodes (not shown). A variety of metal lines 109 may be formed with a substantially constant interval on interlayer insulating layer 108.

First overcoat layer 110 may be formed on a surface (for example, the entire surface) of semiconductor substrate including metal line 109. Color filter layer 111 may be formed on first overcoat layer 110.

Also, second overcoat layer 112 may be formed on a surface (for example, the entire surface) of semiconductor substrate including color filter layer 111. Microlenses 113 may be formed on second overcoat layer 112 to correspond to locations of respective color filters of color filter layer 111.

Hemisphere-shaped microlenses 113 may be formed, for example by coating a resist on second overcoat layer 112, selectively patterning the resist to form a resist pattern, and performing reflow on the resist pattern at a prescribed temperature.

However, according to the related art, the hemisphere-shaped microlenses may be formed by forming a resist pattern on second overcoat layer 112 and performing reflow on the resist pattern. Therefore, a degree of light condensing may be low.

Also, according to the related art, a lens shape may be difficult to control. Therefore, controlling an aspherical coefficient may not be easy.

Also, according to the related art, adjacent microlenses may merge together depending on density of the resist pattern.

SUMMARY

Embodiments relate to a complementary metal oxide semiconductor (CMOS) image sensor and a method for manufacturing the same.

Embodiments relate to a CMOS image sensor and a method for manufacturing the same, that may be capable of improving a degree of light condensing and easily controlling an aspherical coefficient.

Embodiments relate to a CMOS image sensor and a method for manufacturing the same, that may be capable of preventing merging of adjacent microlenses.

In embodiments, a complementary metal oxide semiconductor image sensor may include a semiconductor substrate including a plurality of photodiodes and transistors with a constant interval, an interlayer insulating layer formed on a surface (for example, the entire surface) of the semiconductor substrate, a color filter layer formed on the interlayer insulating layer, respective color filters of the color filter layer corresponding to respective photodiodes, an overcoat layer having a trench of a rounded shape in a portion corresponding to each photodiode and formed on a surface (for example, the entire surface) of the semiconductor substrate, and a plurality of microlenses each having a convex lens shape and being formed inside the trench.

In embodiments, a method for manufacturing a complementary metal oxide semiconductor image sensor may include forming a plurality of photodiodes and a variety of transistors with a constant interval on a semiconductor substrate forming an interlayer insulating layer on a surface (for example, the entire surface) of the semiconductor substrate forming a color filter layer on the interlayer insulating layer such that respective color filters of the color filter layer correspond to respective photodiodes forming an overcoat layer on a surface (for example, the entire surface) of the semiconductor substrate including the color filter layer selectively removing the overcoat layer to a predetermined thickness from a surface of the overcoat layer in order to correspond to the respective photodiodes to form trenches having a rounded shape and forming microlenses each having a convex lens shape inside the trenches.

DETAILED DESCRIPTION OF EMBODIMENTS

Figure 1:
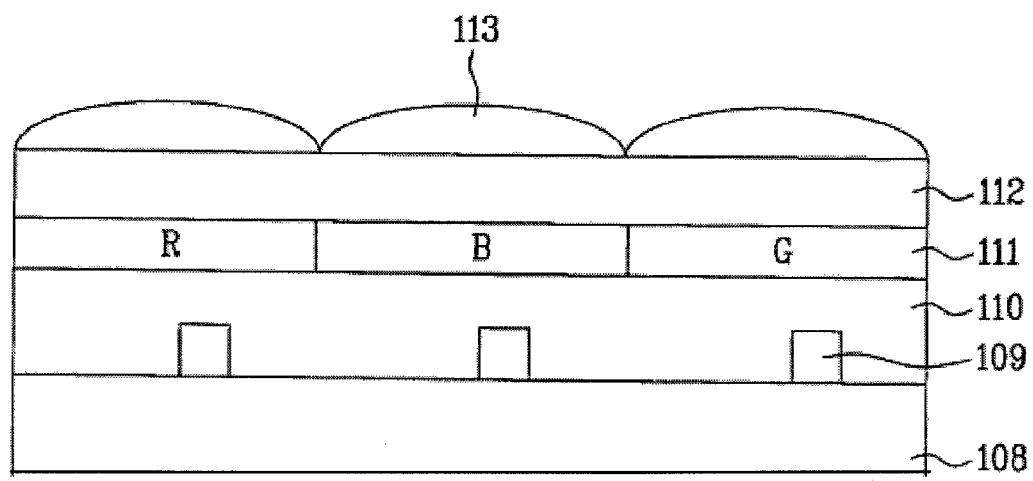
FIG. 1 is an example cross-sectional diagram of a related art CMOS image sensor.
Figure 2:
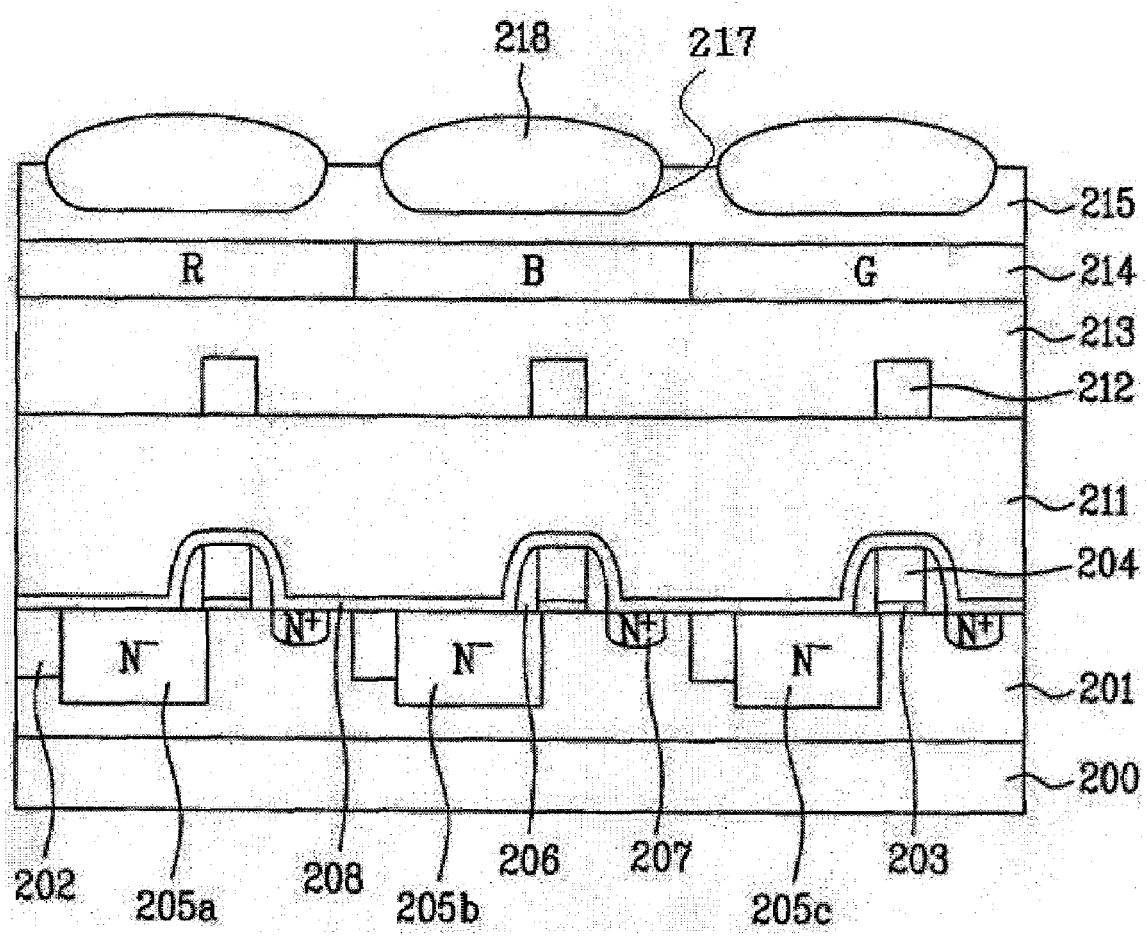
FIG. 2 is an example cross-sectional diagram of a CMOS image sensor according to embodiments.

Referring to FIG. 2, p$^-$-type epitaxial layer 201 may be formed on p$^{++}$-type semiconductor substrate 200, which may include a device isolation region, and an active region, including a photodiode region and a transistor region. Device isolation layer 202, which may isolate input regions of green light, red light, and blue light, may be formed in the device isolation region of semiconductor substrate 200. N-type diffusion regions 205a, 205b, and 205c may be formed in the photodiode region of semiconductor substrate 200.

Gate electrodes 204 may be formed in the transistor region of semiconductor substrate 200 with gate insulating layer 203 interposed. Insulating layer sidewall 206 may be formed on both sides of gate electrode 204. Diffusion barrier layer 208 may be formed on a surface (for example, the entire surface) of the semiconductor substrate 200, including gate electrodes 204. Also, source/drain impurity regions 207 of the transistor may be formed in one side of gate electrode 204.

Interlayer insulating layer 211 may be formed on diffusion barrier layer 208. A variety of metal lines 212 may be formed at a substantially a constant interval on interlayer insulating layer 211.

First overcoat layer 213 may be formed on a surface (for example, the entire surface) of semiconductor substrate 200 including metal line 212. Red (R) color filter, a blue (B) color filer, and a green (G) color filter (214) may be formed on first overcoat layer 213, and may correspond to locations of $n^-$-type diffusion regions 205a, 205b, and 205c, respectively.

Second overcoat layer 215, which may have trenches 217 of a substantially rounded shape, may be formed on a surface (for example, the entire surface) of semiconductor substrate 200 including the respective color filters, and may correspond to locations of respective $n^-$-type diffusion regions 205a, 205b, and 205c. Microlenses 218 may be formed, and may have a shape convex inwardly and outwardly including the insides of trenches 217 of second overcoat layer 215, and may correspond to locations of the respective color filters of color filter layer 214. Hence, in embodiments, the microlenses may be substantially oblongly spherical.

A CMOS image sensor according to embodiments may form microlenses in a vertically convex shape like a convex lens, and may improve a light condensing ability. Sensitivity may thus be increased.

According to embodiments, second overcoat layer 215 may be anisotropic-etched, and may have trenches of a substantially rounded shape. An aspherical coefficient of a lower spherical surface of the trench may thereby be controlled to freely form a focal length.

Also, according to embodiments, merging of adjacent microlenses may be reduced or removed.

FIGS. 3 to 10 are example cross-sectional diagrams illustrating a method for manufacturing a CMOS image sensor according to embodiments.

Figure 3:
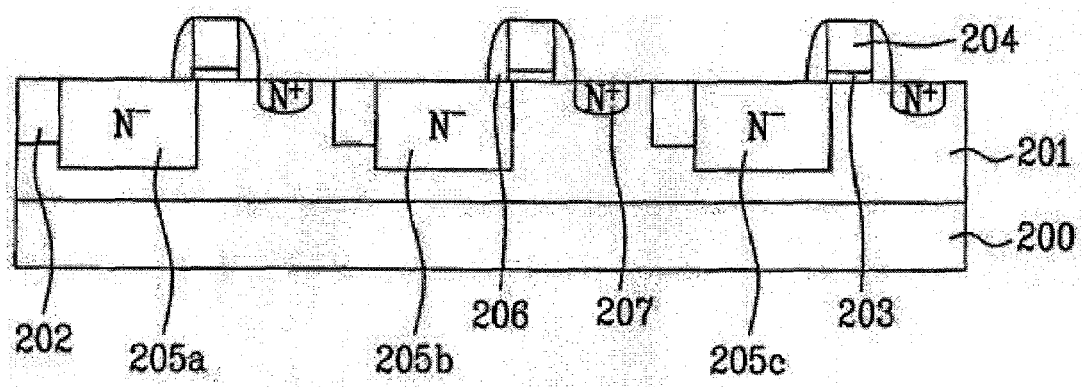
FIGS. 3 to 10 are example cross-sectional diagrams illustrating a method for manufacturing a CMOS image sensor according to embodiments.

Referring to FIG. 3, low concentration first conduction type ($P^-$-type) epitaxial layer 201 may be formed on semiconductor substrate 200, such as a high concentration first conduction type ($p^{++}$-type) polycrystal silicon, using an epitaxial process.

In embodiments, epitaxial layer 201 may be intended for forming large and deep depletion regions in a photodiode to increase an ability of a low voltage photodiode to collect light charges, and may improve light sensitivity.

Semiconductor substrate 200 may be defined as a photodiode region, a transistor region, and a device isolation layer. Device isolation layer 202 may be formed in the device isolation region using a shallow trench isolation (STI) process or a local oxidation of silicon (LOCOS) process.

Gate insulating layer 203 and a conductive layer (e.g., a high concentration polycrystal silicon layer) may be sequentially deposited on a surface (for example, the entire surface) of epitaxial layer 201 in which device isolation layer 202 may be formed. The conductive layer and gate insulating layer 203 may be selectively removed to form gate electrode 204 of each transistor.

Gate insulating layer 203 may be formed using thermal oxidation or chemical vapor deposition (CVD). A silicide layer may be further formed on the conductive layer to form gate electrode 204.

Thermal oxidation may be performed on gate electrode 204 and a surface of semiconductor substrate 200, and may form a thermal oxide layer (not shown).

A width of gate electrode 204 may be made greater than a width of a related art gate electrode to reflect an amount of increase in a thickness of the thermal oxide layer.

Low concentration second conduction type ($n^-$-type) impurity ions may be implanted in the photodiode region of semiconductor substrate 200 to form the $n^-$-type diffusion regions 205a, 205b, and 205c.

An insulating layer may be formed on a surface (for example, the entire surface) of semiconductor substrate 200. Etch-back may be performed to form insulating layer sidewalls 206 on both sides of gate electrode 204.

High concentration second conduction type ($n^+$-type) impurity ions may be implanted in the transistor region of semiconductor substrate 200 to form high concentration $n^+$-type diffusion regions 207.

Figure 4:
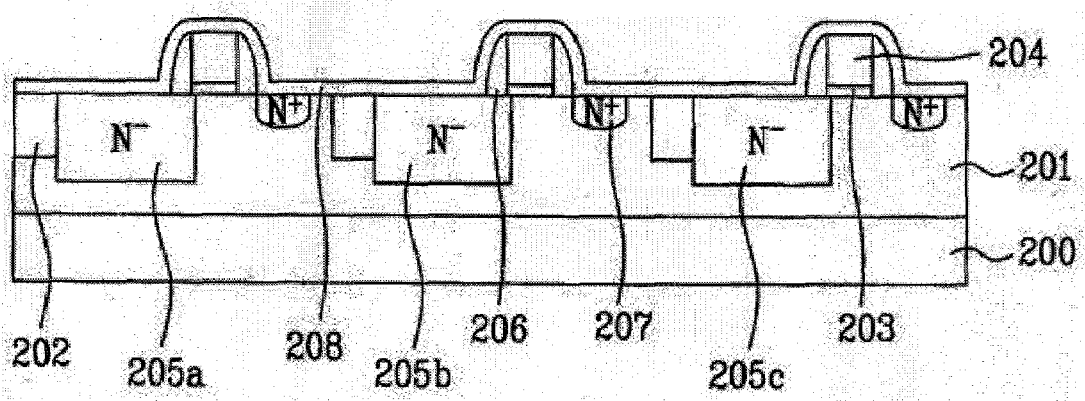

Referring to FIG. 4, a heat treatment process (e.g., a rapid heat treatment process) may be performed on semiconductor substrate 200 to diffuse the impurity ions contained in $n^-$-type diffusion regions 205a, 205b, and 205c, and high concentration $n^+$-type diffusion regions 207.

$N^-$-type diffusion regions (not shown) may be formed in the transistor region using lower ion implantation energy than ion implantation energy used for forming $n^-$-type diffusion regions 205a, 205b, and 205c before high concentration $n^+$-type diffusion regions 207 are formed.

Nitride layer 208, which may serve as a diffusion barrier, may be formed on a surface (for example, the entire surface) of semiconductor substrate 200.

In embodiments, nitride layer 208 may be formed to have a thickness of about 100-600 Å. Nitride layer 208 may have any thickness as far as the thickness is determined with consideration of a reflection effect and a minimum thickness for a diffusion barrier.

Figure 5:
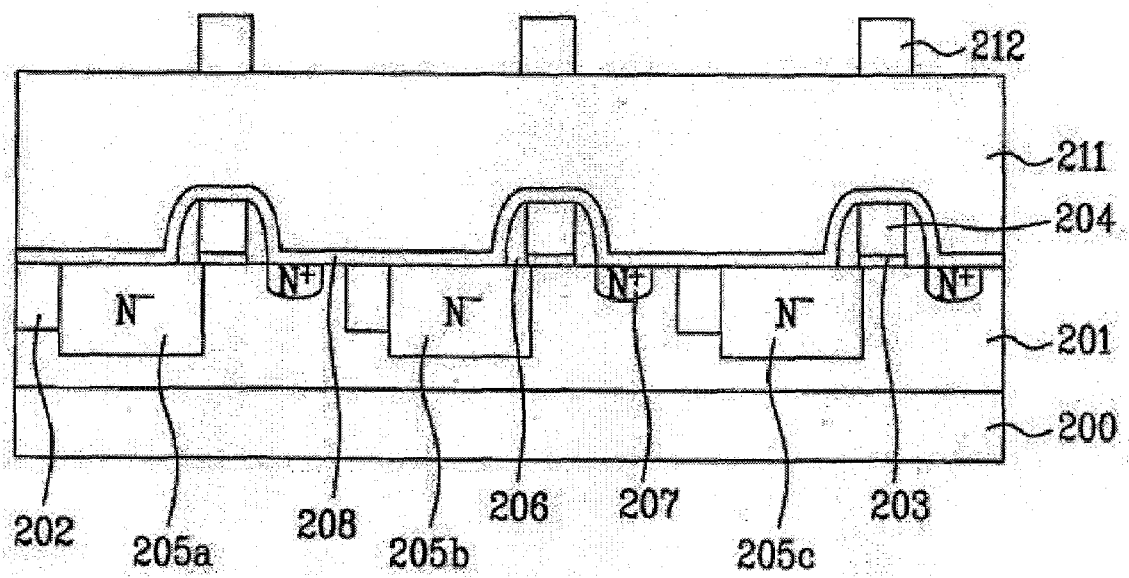

Referring to FIG. 5, interlayer insulating layer 211 may be formed on a surface (for example, the entire surface) of semiconductor substrate 200.

In embodiments, interlayer insulating layer 211 may be formed using a silane-based interlayer insulating layer. A large amount of hydrogen ions contained in the silane-based interlayer insulating layer may recover dangling bonds of semiconductor substrate 200, and may reduce a dark current.

A metal layer may be deposited on interlayer insulating layer 211. The metal layer may be selectively etched, for example using photolithography, and may form metal lines 212.

Figure 6:
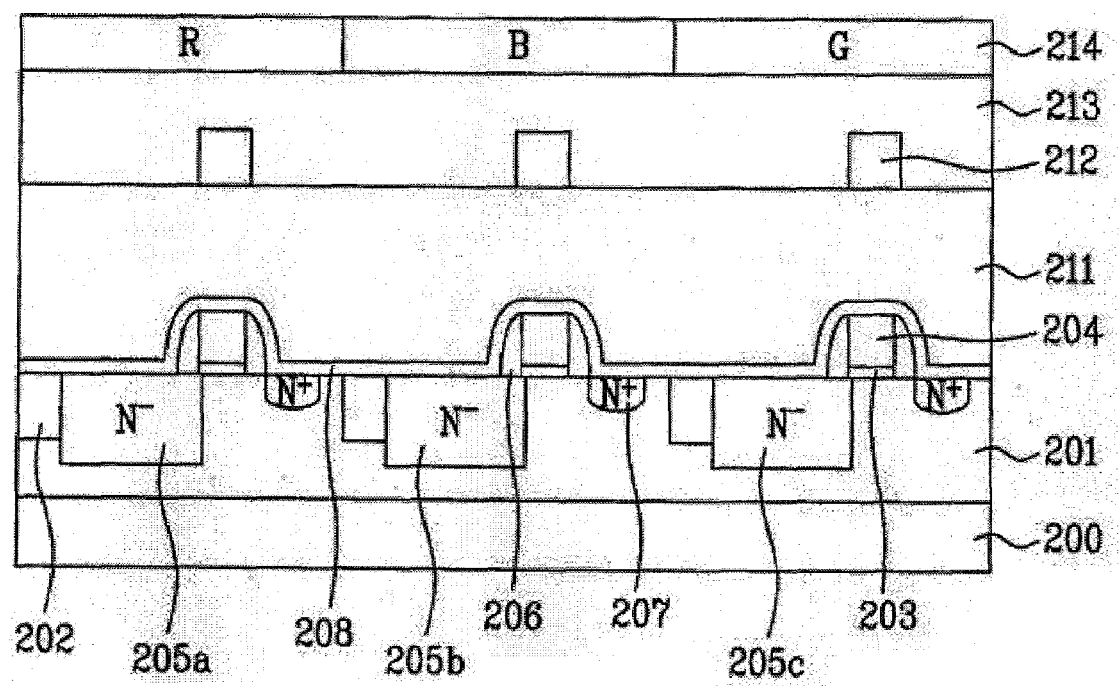

Referring to FIG. 6, first overcoat layer 213 may be formed on a surface (for example, the entire surface) of semiconductor substrate 200 including metal lines 212. A red (R) color filter, a blue (B) color filer, and a green (G) color filter of color filter layer 214 may be formed on first overcoat layer 213, and may correspond to locations of n-type diffusion regions 205a, 205b, and 205c, respectively.

In embodiments, color filter layer 214 may include color filters for filtering light for each wavelength band, and may be formed by coating a dyeable resist on first overcoat layer 213 and performing exposure and development processes on the dyeable resist.

Also, a photoresist may be coated such that respective color filters constituting color filter layer 214 may have a thickness of 1-5 µm, and the coated photoresist may be patterned through photolithography that uses a separate mask. Color filter layer 214 may therefore include color filters for filtering light for each wavelength band may be formed in a single layer.

Figure 7:
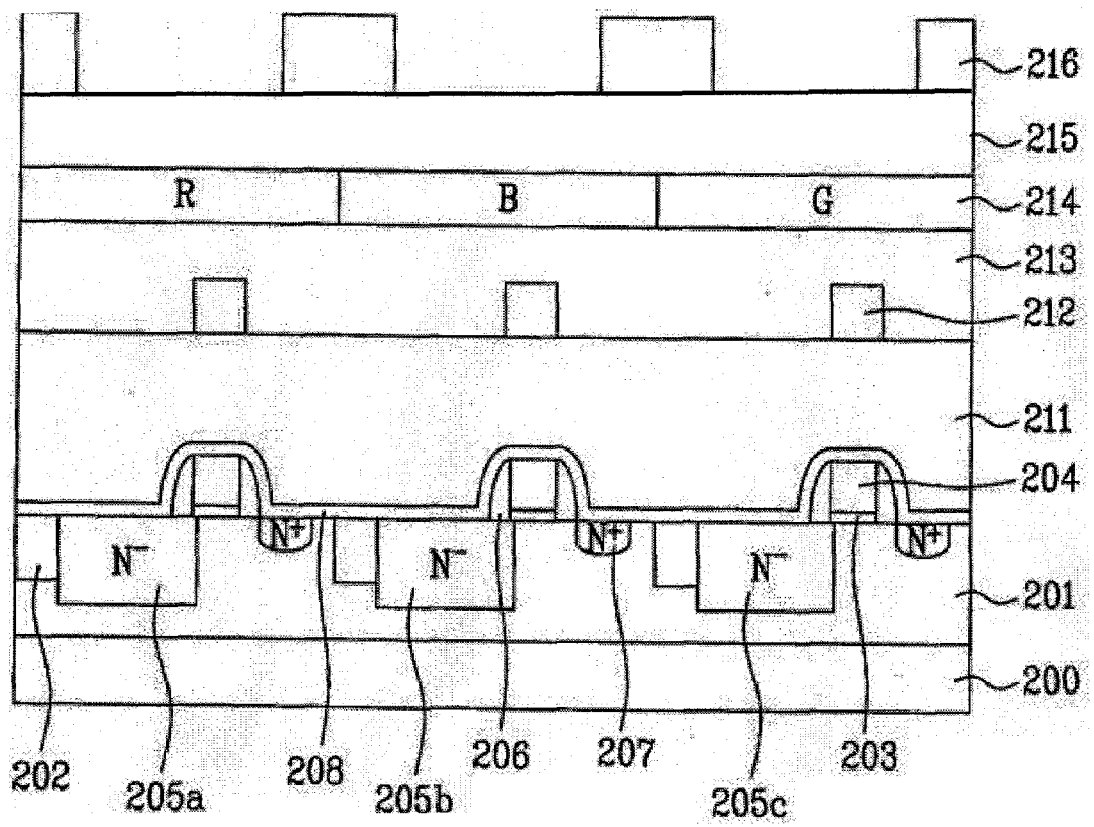

Referring to FIG. 7, second overcoat layer 215 may be formed on a surface (for example, the entire surface) of semiconductor substrate 200 including color filter layer 214.

In embodiments, second overcoat layer 215 may be formed on a surface (for example, the entire surface) of semiconductor substrate 200 including color filter layer 214 to achieve reliability using a transparent insulating layer serving as an epoxy molding compound (EMC) and having high light transmittance, while preventing external moisture or heavy metal from penetrating into the device.

In embodiments, second overcoat layer 215 may be formed by depositing a low temperature oxide (LTO) layer at a temperature of 300° C. or below.

Since optical transmission may be important in an image sensor, second overcoat layer 215 may be formed to have a thickness of approximately 1000-6000 Å to exclude interference that may be caused by thin layers.

Referring still to FIG. 7, photoresist layer 216 may be coated on a surface (for example, the entire surface) of semiconductor substrate 200 including second overcoat layer 215. Photoresist layer 216 may be patterned using exposure and development processes such that portions corresponding to n⁻-type diffusion regions 205a, 205b, and 205c may be open.

Figure 8:
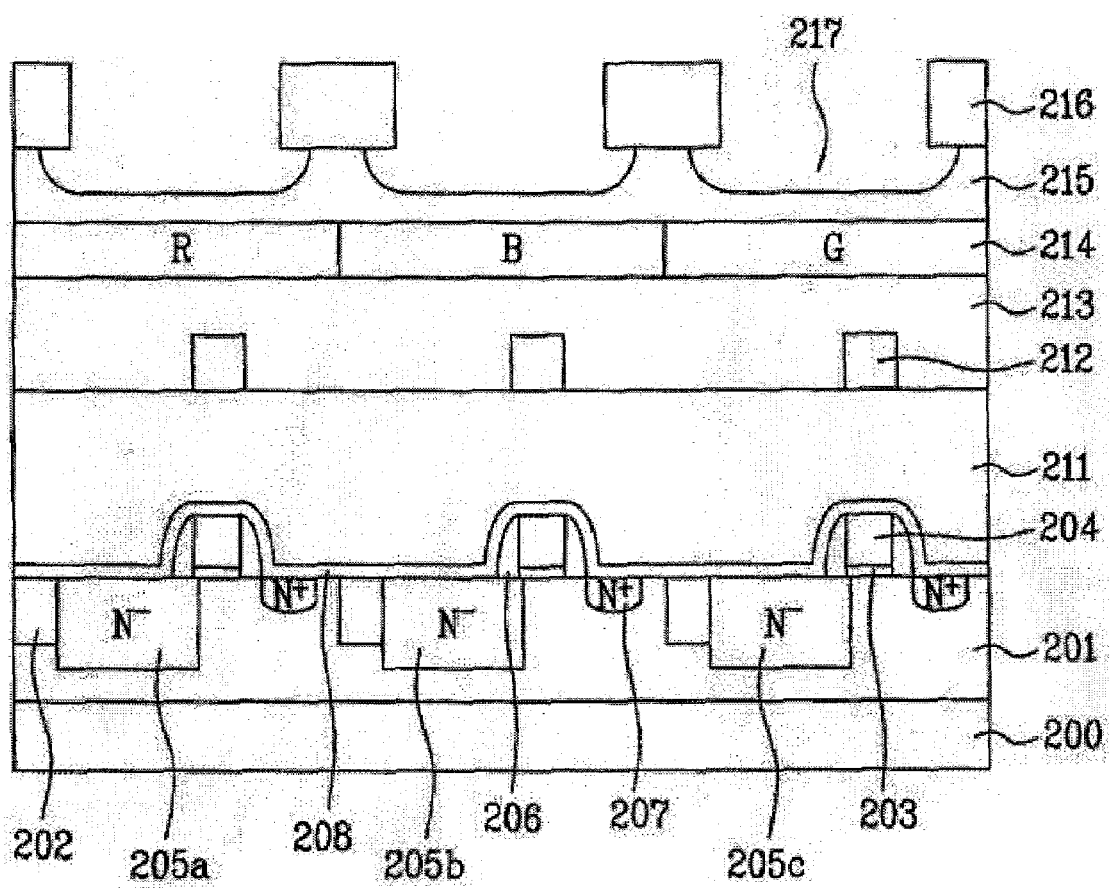

Referring to FIG. 8, second overcoat layer 215 may be isotropic-etched to a prescribed thickness from a surface using patterned photoresist layer 216 as a mask, and may form trenches 217 having a substantially rounded shape.

In embodiments, second overcoat layer 215 may be etched using wet etching to form trench 217 having the rounded shape.

Figure 9:
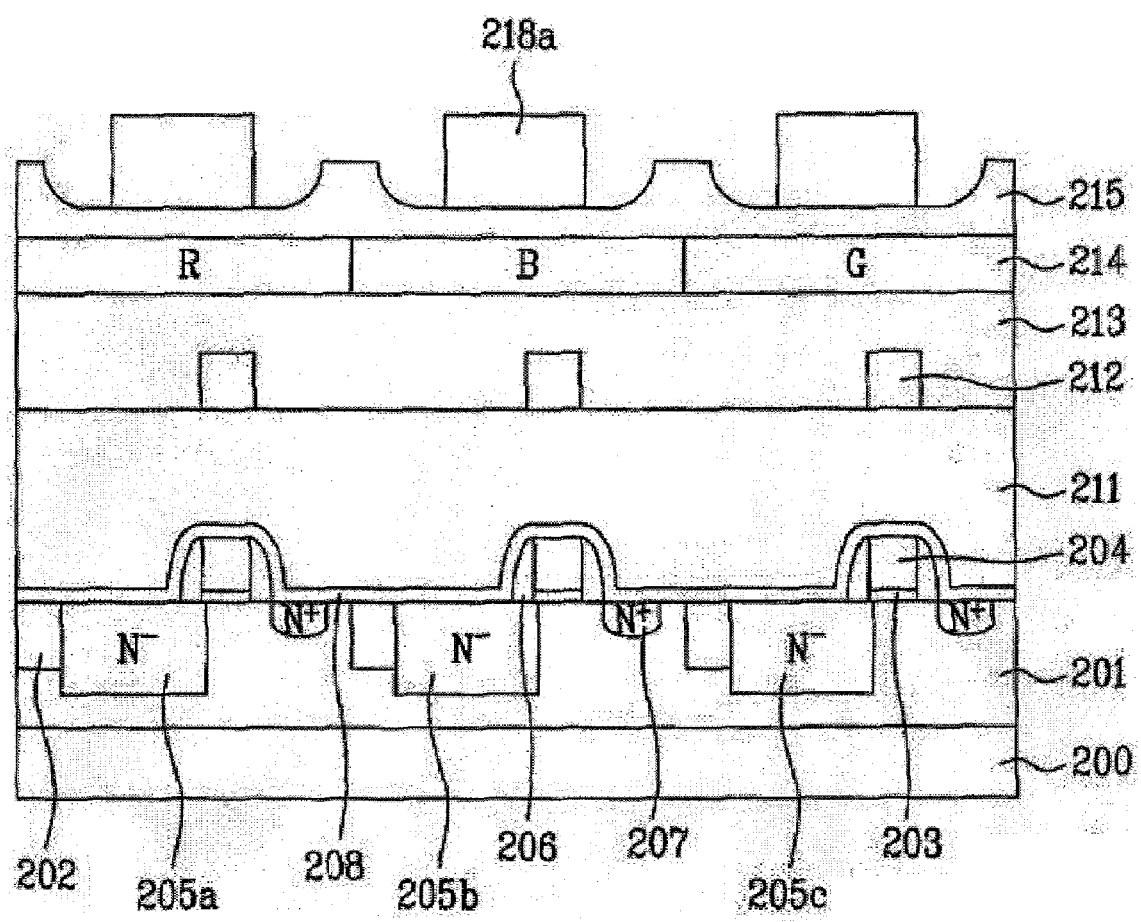

Referring to FIG. 9, photoresist layer 216 may be removed. A resist for microlenses may be coated on a surface (for example, the entire surface) of semiconductor substrate 200 including trench 217, and may efficiently condense light onto n⁻-type diffusion regions 205a, 205b, and 205c.

The resist may be selectively patterned, for example using exposure and development processes, and may form microlens patterns 218a.

In embodiments, if the photoresist is a positive resist, a photo active compound of an initiator, which may be an absorber of the photoresist, may be decomposed to improve transmittance. Therefore, the photo active compound remaining within the microlens patterns may be decomposed using flood exposure.

In embodiments, the flood exposure may be performed on microlens patterns 218a, and may increase transmittance. A photo acid may be generated to increase flowability of the microlenses.

Figure 10:
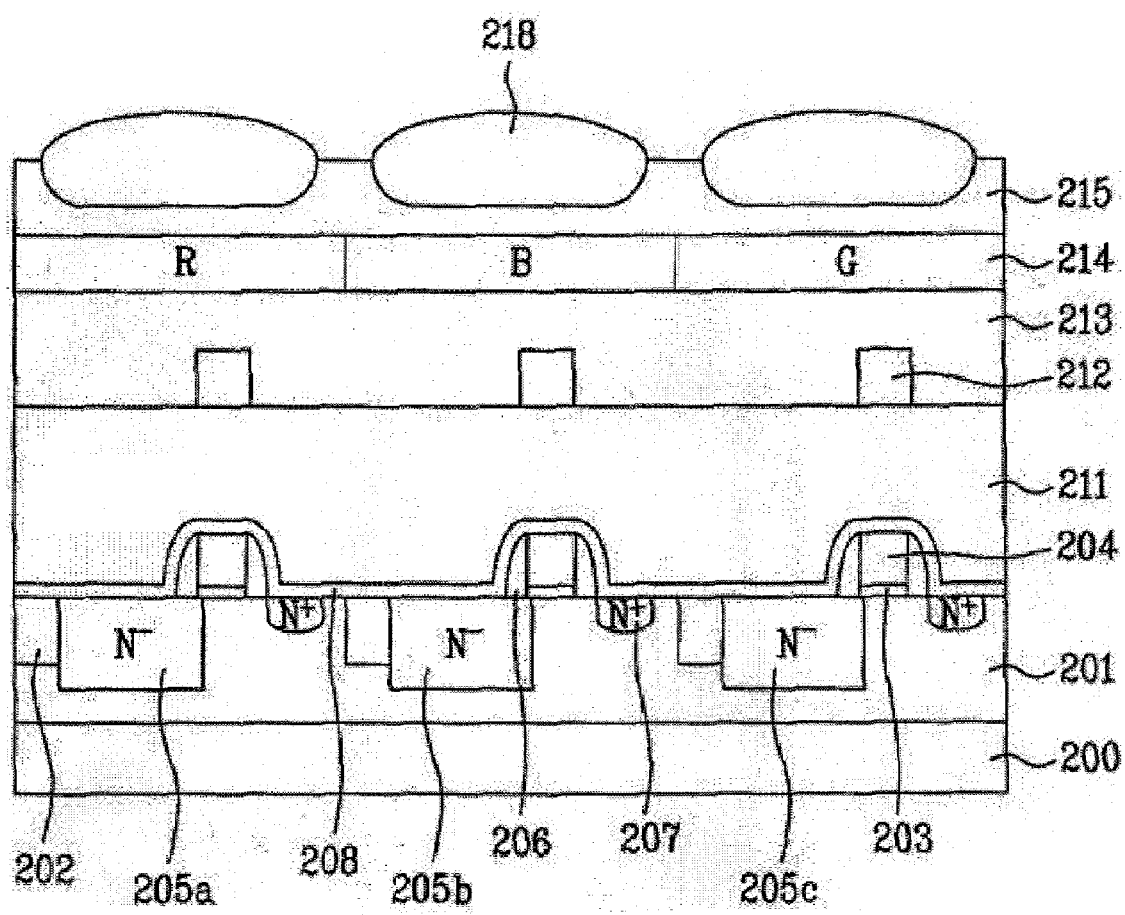

Referring to FIG. 10, semiconductor substrate 200, including the microlens patterns, may be placed on a hot plate (not shown) and heat-treated at a temperature in a range of approximately 150-300° C. to reflow microlens patterns 218a. Hemisphere-shaped microlenses 218 may thereby be formed.

Microlenses 218 may be cooling-processed. In embodiments, the cooling process may be performed with semiconductor substrate 200 placed on a cool plate.

Also, an ultraviolet (UV) may be illuminated onto microlenses 218 to cure microlenses 218. In embodiments, microlenses 218 may be maintained at an optimum curvature radius by illuminating a UV onto microlenses 218 to cure microlenses 218.

According to embodiments, microlenses may be formed in a vertical convex shape like a convex lens and may improve an ability to condense light. Sensitivity may thereby be enhanced.

Also, according to embodiments, trenches having a substantially rounded shape may be formed in an overcoat layer, for example using anisotropic etching to control aspherical coefficients of lower spherical surfaces of the trenches, and may thus freely form a focal length. This may simplify a fabrication process.

Also, according to embodiments, after microlens patterns may be formed inside trenches, reflow may be performed on the microlens patterns, and may form microlenses having a vertical convex shape inside the trenches. Merging of adjacent microlenses may be removed, and an amount of a resist may be more easily controlled.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a plurality of photodiodes on a semiconductor substrate;
   forming a color filter layer over the semiconductor substrate such that respective color filters of the color filter layer correspond to locations of respective photodiodes;
   forming an overcoat layer over the color filter layer;
   selectively removing portions of the overcoat layer to a prescribed thickness from a surface of the color filter layer to correspond to locations of the respective photodiodes to form trenches having a substantially rounded shape over corresponding photodiodes; and
   forming microlenses, each having a convex lens shape, inside each of the trenches
   wherein the forming microlenses comprises coating a resist on a surface of the trenches, selectively patterning the resist to form microlens patterns, and performing reflow on the microlens patterns at a prescribed temperature,
   wherein the microlens patterns are formed only in the trench.

2. The method of claim 1, further comprising forming an interlayer insulating layer over the semiconductor substrate, and forming the color filter layer over the interlayer insulating layer.

3. The method of claim 2, wherein the interlayer insulating layer comprises at least one of a phosphosilicate glass layer, a borosilicate glass layer, and a borophosphosilicate glass layer.

4. The method of claim 1, wherein the overcoat layer comprises a transparent insulating layer.

5. The method of claim 4, wherein the overcoat layer comprises a low temperature oxide layer.

6. The method of claim 5, wherein the low temperature oxide layer is formed at a temperature of 300° C. or below.

7. The method of claim 5, further comprising decomposing a photo active compound remaining within the microlens patterns by performing a flood exposure to the microlens patterns.

8. The method of claim 4, wherein the overcoat layer is formed to have a thickness of 1000-6000 Å.

9. The method of claim 1, wherein the overcoat layer is removed using isotropic etching.

10. The method of claim 9, wherein the isotropic etching is wet etching.

11. The method of claim 1, wherein the prescribed temperature for the reflow on the microlens patterns is in a range of 150-300° C.

12. The method of claim 1, wherein the microlenses are substantially oblongly spherically shaped.

13. The method of claim 1, further comprising illuminating an ultraviolet light onto the microlenses.

* * * * *